United States Patent
Wu et al.

(10) Patent No.: US 7,432,149 B2
(45) Date of Patent: Oct. 7, 2008

(54) CMOS ON SOI SUBSTRATES WITH HYBRID CRYSTAL ORIENTATIONS

(75) Inventors: I-Lu Wu, Hsin-Chu (TW); Chung-Te Lin, Kaohsiung (TW); Tan-Chen Lee, Panchiao (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 331 days.

(21) Appl. No.: 11/290,914

(22) Filed: Nov. 30, 2005

(65) Prior Publication Data

US 2006/0292770 A1    Dec. 28, 2006

Related U.S. Application Data

(60) Provisional application No. 60/693,384, filed on Jun. 23, 2005.

(51) Int. Cl.
    *H01L 21/8238* (2006.01)
(52) U.S. Cl. .............. 438/222; 438/150; 438/154; 438/198; 438/221; 438/404; 257/64; 257/68; 257/351; 257/E21.562
(58) Field of Classification Search ............ 438/150, 438/154, 198, 221, 222, 404, 406; 257/64, 257/69, 351, E21.562
    See application file for complete search history.

(56) References Cited

U.S. PATENT DOCUMENTS

| | | | | |
|---|---|---|---|---|
| 4,442,448 A * | 4/1984 | Shimbo | ............. | 257/69 |
| 4,857,986 A | 8/1989 | Kinugawa | | |
| 4,889,829 A * | 12/1989 | Kawai | ............. | 438/405 |
| 5,384,473 A * | 1/1995 | Yoshikawa et al. | .......... | 257/255 |
| 6,107,125 A | 8/2000 | Jaso et al. | | |
| 6,660,588 B1 | 12/2003 | Yang et al. | | |
| 6,784,071 B2 | 8/2004 | Chen et al. | | |
| 6,878,646 B1 | 4/2005 | Tsai et al. | | |
| 6,879,000 B2 | 4/2005 | Yeo | | |
| 6,902,962 B2 * | 6/2005 | Yeo et al. | ............. | 438/150 |
| 6,967,132 B2 * | 11/2005 | Gonzalez et al. | ............. | 438/199 |
| 6,972,478 B1 * | 12/2005 | Waite et al. | ............. | 257/627 |
| 7,023,055 B2 * | 4/2006 | Ieong et al. | ............. | 257/369 |
| 7,208,815 B2 * | 4/2007 | Chen et al. | ............. | 257/627 |
| 7,268,377 B2 * | 9/2007 | Ieong et al. | ............. | 257/255 |
| 7,298,009 B2 * | 11/2007 | Yan et al. | ............. | 257/357 |
| 2004/0256700 A1 * | 12/2004 | Doris et al. | ............. | 257/627 |
| 2005/0035345 A1 | 2/2005 | Lin et al. | | |
| 2005/0082531 A1 * | 4/2005 | Rim | ............. | 257/72 |
| 2006/0073646 A1 * | 4/2006 | Yang | ............. | 438/152 |
| 2006/0091427 A1 * | 5/2006 | Waite et al. | ............. | 257/213 |
| 2006/0148154 A1 * | 7/2006 | Shin et al. | ............. | 438/198 |

(Continued)

*Primary Examiner*—George Fourson
*Assistant Examiner*—John M Parker
(74) *Attorney, Agent, or Firm*—Slater & Matsil, L.L.P.

(57) ABSTRACT

Methods and structures for CMOS devices with hybrid crystal orientations using double SOI substrates is provided. In accordance with preferred embodiments, a manufacturing sequence includes the steps of forming an SOI silicon epitaxy layer after the step of forming shallow trench isolation regions. The preferred sequence allows hybrid SOI CMOS fabrication without encountering problems caused by forming STI regions after epitaxy. A preferred device includes an NFET on a {100} crystal orientation and a PFET on a {110} crystal orientation. An NMOS channel may be oriented along the <100> direction, which is the direction of maximum electron mobility for a {100} substrate. A PMOS channel may be oriented along the <110> direction, which is the direction where hole mobility is maximum for a {110} substrate.

26 Claims, 4 Drawing Sheets

U.S. PATENT DOCUMENTS

2006/0170045 A1* 8/2006 Yan et al. .................... 257/347
2006/0194421 A1* 8/2006 Ieong et al. ................. 438/510
2006/0281235 A1* 12/2006 Tayanaka .................... 438/151
2006/0284251 A1* 12/2006 Hsu et al. ................... 257/347

* cited by examiner

CMOS ON SOI SUBSTRATES WITH HYBRID CRYSTAL ORIENTATIONS

This application claims the benefit of U.S. Provisional Application No. 60/693,384 filed on Jun. 23, 2005, entitled "CMOS on SOI Substrates with Hybrid Crystal Orientations," which application is hereby incorporated by reference in its entirety.

TECHNICAL FIELD

This invention relates generally to semiconductor fabrication and more particularly to methods and structures for CMOS fabrication using double SOI substrates and hybrid crystal orientations.

BACKGROUND

Conventional silicon-on-insulator (SOI) CMOS devices typically have a thin layer of silicon, also known as the active layer, on an insulator layer such as a buried oxide (BOX) layer. Active devices, such as MOS transistors (MOSFETs), are formed in active regions within the active layer. The size and placement of the active regions are defined by isolation regions, such as shallow trench isolation (STI) regions. Active devices in the active regions are isolated from the substrate by the BOX layer.

Devices formed on SOI substrates exhibit many improved performance characteristics over their bulk substrate counterparts. SOI substrates are particularly useful in reducing problems relating to reverse body effects, device latch-up, soft-error rates, and junction capacitance. SOI technology therefore enables higher speed performance, higher packing density, and reduced power consumption.

Conventional CMOS technology typically includes fabricating NMOS and PMOS devices on active regions consisting of a semiconductor layer having a single crystal orientation. This, however, is not the optimum CMOS configuration because electrons have their greatest mobility in the {100} family of planes, while holes have their greatest mobility in the {110} family of planes. Consequently, one type of device is frequently fabricated with the optimum crystal orientation, while the other type of device functions with less than optimal carrier mobility.

Workers have recognized these problems and have developed techniques for fabricating CMOS devices on SOI hybrid substrates. Such substrates have multiple crystal orientations that are independently optimized for NMOS and PMOS devices. For example, U.S. Pat. No. 5,384,473 to Yoshikawa et al. describes a method for fabricating PFETs on (110) surfaces and NFETs on (100) surfaces through wafer bonding and selective epitaxy. U.S. Pat. No. 6,107,125 to Jaso et al. describes overcoming floating body effects in SOI substrates. U.S. Pat. No. 4,889,829 to Kawai describes the formation of transistors in SOI substrates. U.S. Pat. No. 4,857,986 to Kinugawa, describes some of the effects of crystal orientation on carrier mobility.

Many problems encountered in CMOS fabrication involve forming isolation regions between different polarity devices. For example, some conventional CMOS hybrid orientation methods include fabricating isolation regions, e.g., shallow trench isolation (STI) regions, before the step of forming an epitaxial silicon layer. This particular fabrication sequence leads to problems. The differential etch rates among various isolation and semiconductor materials complicates manufacturing of hybrid orientation CMOS devices. Accordingly, conventional CMOS manufacturing methods that include forming STI regions after SOI epitaxy suffer yield losses from etching of isolation regions.

What are needed then are more robust manufacturing methods and device structures to more effectively integrate CMOS isolation structures and SOI hybrid orientation technology.

SUMMARY OF THE INVENTION

These and other problems are generally solved or circumvented, and technical advantages are generally achieved, by preferred embodiments of the present invention that provide methods and structures for CMOS devices having hybrid crystal orientations on double SOI substrates. A preferred manufacturing sequence includes the steps of forming an SOI silicon epitaxy layer after the steps of forming the shallow trench isolation regions. The preferred sequence allows hybrid SOI CMOS fabrication without encountering etch selectivity problems caused by forming STI regions after epitaxy.

A preferred embodiment of the invention provides a method for fabricating a semiconductor device. A preferred embodiment comprises fabricating a CMOS device on a double SOI substrate. The CMOS preferably includes an NMOS device fabricated on one crystal orientation and a PMOS device fabricated on another crystal orientation. In accordance with another preferred embodiment, the semiconductor device may include an integrated circuit. The integrated circuit may comprise at least two devices, with the first device on one substrate with a first crystal orientation, and the second device on another substrate with a second crystal orientation.

An embodiment of the invention provides a semiconductor manufacturing method. A method comprises forming a stacked arrangement of layers over a substrate. The embodiments comprise forming a first buried oxide (BOX) layer over the substrate, a first semiconductor layer having a first orientation over the first BOX layer, a second BOX layer over the first semiconductor layer, a second semiconductor layer having a second orientation over the second BOX layer, a pad oxide layer over the second BOX layer, a first hard mask layer over the pad oxide layer, and a second hard mask layer over the first hard mask layer. Forming the stacked arrangement of layers preferably includes a wafer bonding process that includes forming a double SOI substrate.

Preferred embodiments of the invention include defining a first, second, and third region in the stacked arrangement of layers. In one embodiment, forming a first recess by etching the first and second hard mask layers, defines the first region. Preferred embodiments include forming a plurality of the first recesses. Preferably, a second recess, which is formed by etching the second hard mask layer, defines a second region. In preferred embodiments, the second region connects a first pair of adjacent first regions. A second pair of adjacent first regions define a third region in the stacked arrangement of layers. In the preferred manufacturing method, the third region defines a portion in the stacked arrangement of layers wherein initially none of the layers are etched so that the first and second hard mask layers connect a second pair of adjacent first regions.

Definition of the first, second, and third regions may comprise a separate manufacturing step, while in other embodiments; the definition may comprise an implicit manufacturing step, not explicitly distinct from other manufacturing steps.

Preferred embodiments of the invention comprise etching through the first plurality of regions to the first BOX layer and filling the resulting recesses with a dielectric. Subsequent processing of the first plurality of regions may form isolation regions, such as shallow trench isolation regions. Processing of the second region preferably includes etching a recess and growing an epitaxial semiconductor layer on the first semiconductor layer.

Preferred embodiments further include planarization and CMOS processing. Planarization includes removing the first and second hard mask layers and the pad oxide layer by planarization, so that the isolation regions, the first semiconductor layer, and the epitaxial semiconductor are co-planar. CMOS processing includes forming NMOS and PMOS devices on the semiconductor and epitaxial layers. The layers preferably include crystal orientations independently optimized for carrier mobility.

For example, in an embodiment of the invention, the epitaxial semiconductor layer comprises (100) silicon on which a PMOS is formed. The second semiconductor layer comprises (110) silicon on which an NMOS is formed. In another embodiment, the epitaxial semiconductor layer comprises (110) silicon on which an NMOS is formed. The second semiconductor layer comprises (100) silicon on which a PMOS is formed. Embodiments of the invention advantageously avoid many manufacturing problems associated with STI formation and CMOS processing.

As noted above, a conventional processing sequence would often require etching of STI regions after SOI epitaxy. This conventional process leads to etch selectivity problems among neighboring layers and regions. Preferred embodiments of the invention, however, advantageously avoid many of these problems because the epitaxy step follows STI formation.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
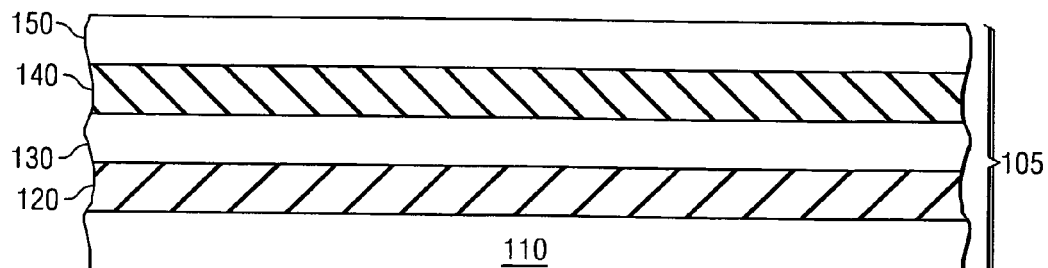
FIG. 1 is a cross sectional view of a double SOI substrate according to the preferred embodiments of the invention.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The present invention will be described with respect to preferred embodiments in a specific context, namely CMOS fabrication using SOI and hybrid substrate orientations. The invention may also be applied, however, to other semiconductor devices wherein electrical isolation of neighboring devices or optimizing carrier mobility is a concern.

Generally, an SOI substrate comprises a layer of a semiconductor material such as silicon, germanium, silicon germanium, silicon on insulator (SOI), silicon germanium on insulator (SGOI), or combinations thereof. The insulator layer may be, for example, a buried oxide (BOX) layer or a silicon oxide layer. The insulator layer is provided on a substrate, typically a silicon or glass substrate. Other substrates that may be used include multi-layered substrates, gradient substrates, or hybrid orientation substrates.

As described below in relation to embodiments of the invention, the charge carrier channel and substrate orientation may be selected with a view towards optimizing the appropriate carrier mobility using SOI or SGOI hybrid orientation substrates. For example, an NMOS channel may be oriented along the <100> direction, which is the direction of maximum electron mobility for a {100} substrate. Alternatively, a PMOS channel may be oriented along the <110> direction, which is the direction where hole mobility is maximum for a {110} substrate. Other surface orientation and channel direction combinations are independently achievable for NMOS and PMOS devices according to embodiments of the invention.

Generally, a primary building block in ULSI circuits is a CMOS logic gate, comprising at least one NFET and at least one PFET. A silicon-on-insulator substrate may be used to implement a CMOS logic gate with different crystal orientations for the PFET and the NFET to provide optimum hole and electron mobility. Devices may be either planar or multiple gate devices such as a FinFET. One advantage of a preferred embodiment is that the real estate of the logic gate may be reduced when carrier mobility is increased. Accordingly, significant real estate on the entire semiconductor chip may be saved by optimizing the crystal orientations to improve carrier mobility. In addition, the manufacturing cost may be effectively reduced.

With reference now to FIG. 1 there is an illustration of a manufacturing sequence according to preferred embodiments of the present invention. Illustrated is a stacked arrangement of layers that comprises a double SOI substrate 105. The double SOI substrate 105 includes a support substrate 110, preferably silicon; an insulator layer, preferably a first BOX layer 120; a first semiconductor layer 130 having a first crystal orientation; a second insulator layer, preferably a second BOX layer 140; and a second semiconductor layer 150 having a second crystal orientation. The double SOI substrate 105 may be formed using wafer bonding methods known in the art. Wafer bonding includes bringing two SOI wafers into intimate contact with each other and heating the two contacted wafers under conditions that are capable of bonding the two wafers together. The heating may include applying an external force and it is typically performed in an inert ambient up to about 1050° C. for up to about 20 hours.

The first 130 and second 150 semiconductor layers may be between about 2 to 200 nm thick and preferably about 40 nm thick. They preferably comprise silicon and have a respective surface orientation and a doping level suitable for an NMOS or PMOS device (e.g., {100} NMOS and {110} PMOS). The first 120 and second 140 BOX layers may have a thickness between about 10 to 200 nm, preferably about 50 nm. Support substrate 110 and the first 130 and second 150 semiconductor layers may include Si, SiC, Ge, GaAs, GaAlAs, InP, GaN, a dielectric, or other semiconductor material.

Figure 2:
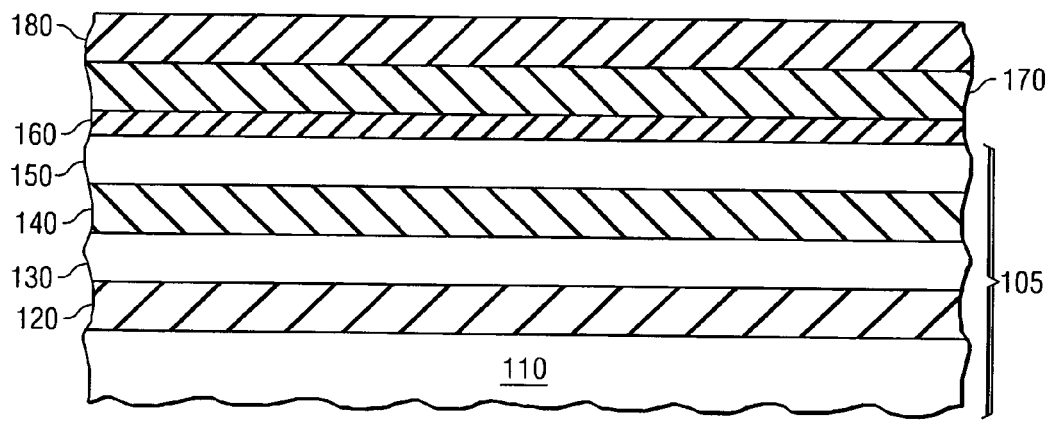
FIG. 2 is a cross sectional view of a stacked arrangement of layers comprising hard mask layers formed over the double SOI substrate.

Turning now to FIG. 2, there is the structure of FIG. 1 after further processing according to embodiments of the invention. A pad oxide 160 about 10 nm thick is formed over the second semiconductor layer 150. A first hard mask layer 170 is formed over the pad oxide layer 160, and a second hard mask layer 180 is formed over the first hard mask layer 170. The first 170 and second 180 hard mask layers may be formed using a CVD, PECVD, or spin-on method and may be comprised of silicon oxide, silicon nitride, or silicon oxynitride. The thickness of the hard mask is in the range of about 20 nm to about 200 nm. A preferred hard mask layer comprises silicon nitride deposited by rapid thermal chemical vapor deposition (RTCVD). RTCVD conditions include a temperature of about 350 to 800° C. with a NH3:SiH4 gas ratio of about 50:1 to 400:1.

Figure 3:
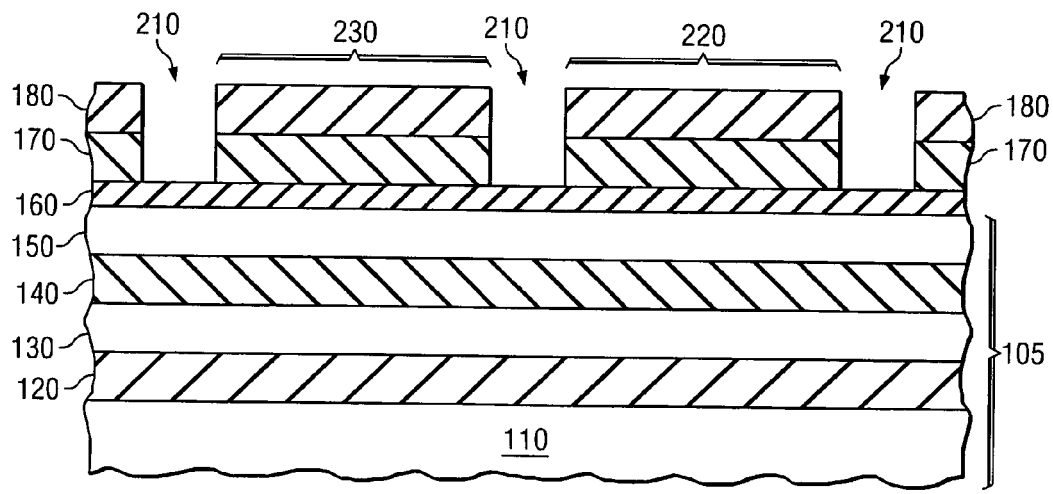
FIGS. 3-5 are cross sectional views illustrating recess formation.

Next, as illustrated in FIG. 3, CMOS fabrication may be described by defining a plurality of isolation regions 210, a first active region 220, and a second active region 230 in the double SOI substrate 105. The region definition may comprise a discrete manufacturing step, as illustrated in FIG. 3. In other embodiments, it may comprise an implicit component of NMOS and PMOS device fabrication. In keeping with the embodiment illustrated in FIG. 1, however, the isolation regions 210 comprise recesses formed through the first 170 and second 180 mask layers. A first pair of recesses defines the first active region 220, and a second pair of recess defines the second active region 230. As described in detail below, the first 220 and second 230 active regions preferably include active semiconductor layers suitable for NMOS or PMOS device fabrication. For ease of illustration, the first 220 and second 230 active regions are illustrated as being separated only by a single recess, but in other embodiments, they may be formed in separate regions of an integrated circuit.

Figure 4:
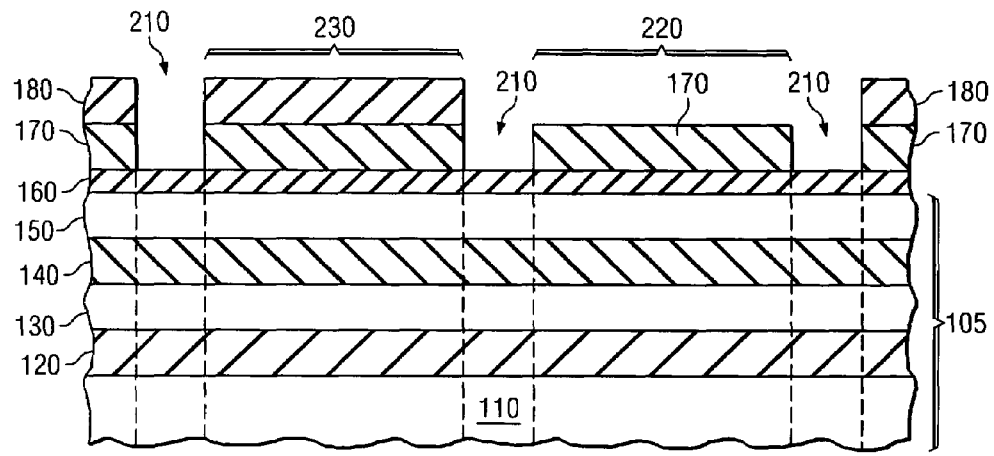
Figure 5:
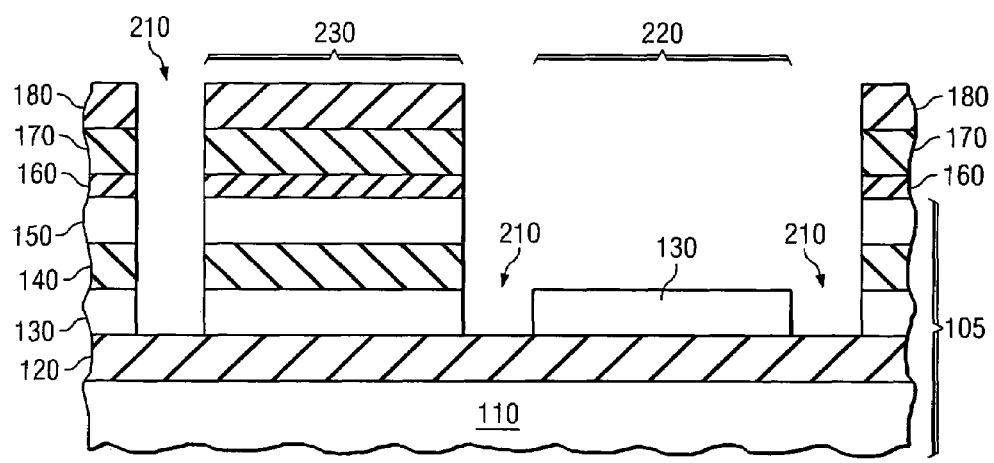

Turning now to FIG. 4, the portion of the second hard mask 180 layer within the first active region 220 is removed by masking/etching methods. Preferably, defining the several regions includes anisotropically etching through the stacked arrangement of layers substantially as shown in FIG. 5. Specifically, embodiments comprise removing by directionally etching layers overlaying the first semiconductor layer 130 within the first active region 220. Preferred embodiments include simultaneously removing the first semiconductor layer 130 and the second BOX layer 140 within the first active region 220, followed by removal of the second semiconductor layer 150 from the first active region 220.

Figure 6:
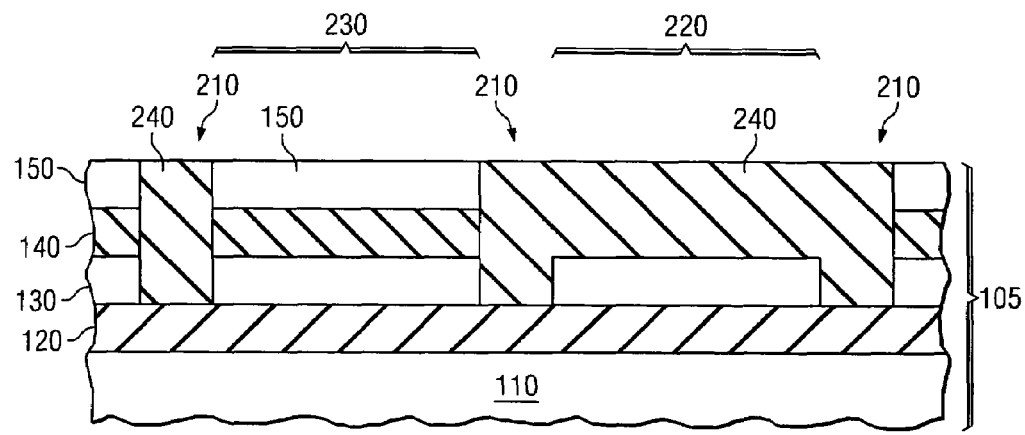
FIG. 6 is cross sectional view illustrating dielectric forming and planarization.

Next, as illustrated in FIG. 6, recesses comprising the isolation 210 and first active regions 220 are filled with a dielectric, preferably an oxide 240. The resulting structure is planarized to remove the first and second hard mask layers and the pad oxide layer. Next, as illustrated in FIG. 7, cap layer 310 is formed.

The cap layer 310 may be deposited by ALD, PVD, PECVD, PEALD, and/or CVD methods, including nitridation and silicidation methods known in the art. The cap layer 310 may include at least one layer of silicon nitride, Co, W, Al, Ta, Ti, Ni, or Ru. Still other embodiments may include a cap layer 310 comprising at least one layer of a carbon-containing dielectric, a nitrogen-containing dielectric, a nitrogen-containing conductive layer, or a silicon-containing layer.

Figure 7:
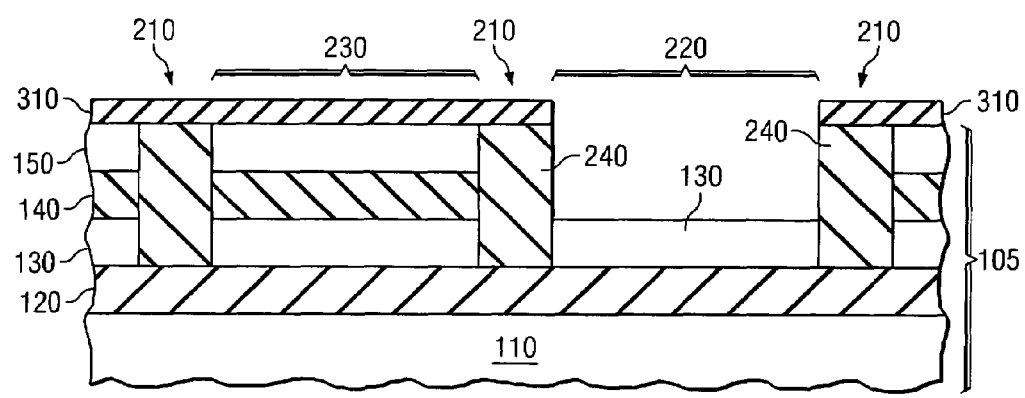
FIGS. 7 and 8 are cross sectional views illustrating hybrid orientation SOI epi-layer formation.
Figure 8:
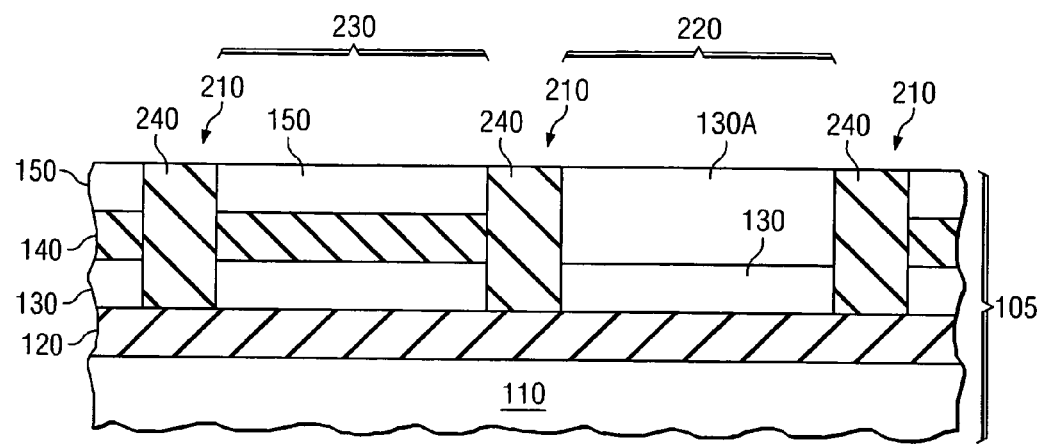

After masking the cap layer 310 and the oxide 240 overlaying the first semiconductor layer 130 within the first active region 220 is lithographically patterned and directionally etched, thereby forming the structure illustrated in FIG. 7. The directional etch process preferably comprises a dry etch such as a reactive ion etching (RIE) process to anisotropically form surface openings or recesses. Then, as illustrated in FIG. 8, an epitaxial layer, which comprises a first active layer 130A, is formed over the first semiconductor layer 130. If necessary, the resulting structure re-planarized, thereby producing the structure of FIG. 8.

The processing sequence of FIGS. 7 and 8 also illustrates advantages of embodiments of the invention in relation to CMOS fabrication. In preferred embodiments, the recesses that comprise isolation regions 210 are formed before the steps of completing semiconductor regions 220 and 230. As noted above, a conventional processing sequence would often require etching of isolation regions 210 after the step of epitaxially growing the first active layer 130A. This conventional process leads to etch selectivity problems among neighboring layers and regions. Preferred embodiments of the invention, however, advantageously avoid many of these problems because the epitaxy step follows isolation region 210 formation.

Figure 9:
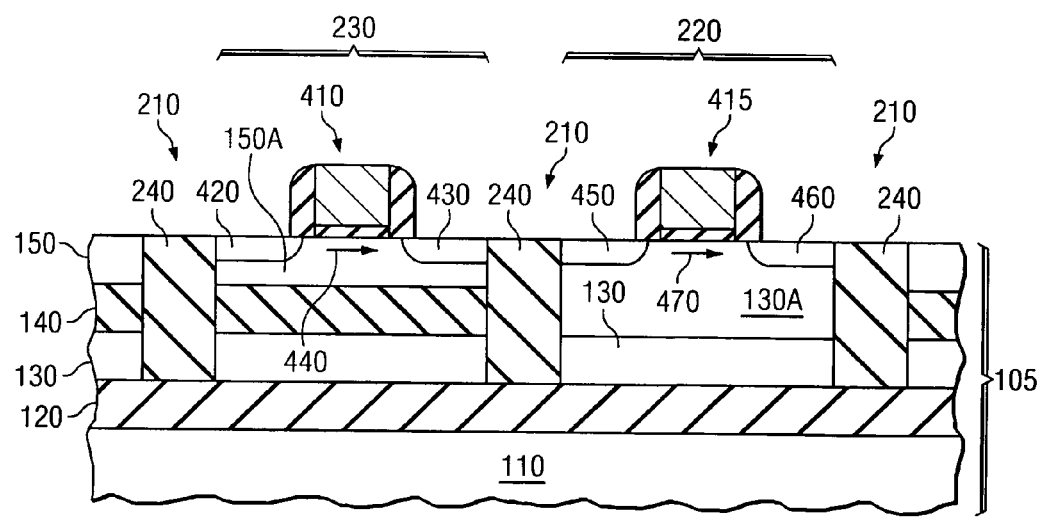
FIG. 9 is a cross sectional view illustrating a preferred fabrication method for orienting PFETs and NFETs on a SOI/epi-layer hybrid orientation substrate.

Following the embodiments of the invention described above, a CMOS device is formed as illustrated in FIG. 9. In a preferred CMOS device, the isolation region 210 of the double SOI substrate 105 comprises STI regions. The first active region 220 comprises a PMOS region and the second active region 230 comprises a NMOS region. In FIG. 9, there are illustrated a PMOS 415 and a NMOS 410 device formed according to methods known in the art. NMOS 410 is formed in the second semiconductor layer 150, which is suitably doped to form a second active layer 150A, which comprises source 420 and drain 430 regions with NMOS channel region 440 in between. The PMOS 415 is formed in the first active 130A, and it comprises respective source/drain 450/460 and channel 470 regions. Because a conventional source/drain implant uses a gate electrode and gate electrode spacers as an implant mask, the source/drain implant may be performed after forming the gate electrode and spacers.

NMOS 410 and a PMOS 415 devices preferably include a gate dielectric such as silicon oxide having a thickness from about 6 to 100 Å, and more preferably less than about 20 Å. In other embodiments, the gate dielectric may include a high-k dielectric having a k-value substantially greater than about 7. Possible high-k dielectrics include $Ta_2O_5$, $TiO_2$, $Al_2O_3$, $ZrO_2$, $HfO_2$, $Y_2O_3$, $L_2O_3$, and their aluminates and silicates. Other suitable high-k gate dielectrics may include a hafnium-based materials such as $HfO_2$, $HfSiO_x$, $HfAlO_x$.

Preferably, the NMOS channel 440 is oriented along the <100> direction, which is the direction of maximum electron mobility when the second semiconductor layer 150 comprises {100} silicon. The PMOS channel 470 is preferably oriented along the <110> direction, which is the direction where hole mobility when the epitaxial layer 130A comprises {110} silicon. In keeping with preferred embodiments of the invention, the deposited oxide 240 comprises STI regions in the CMOS structure.

In other embodiments, the first active area 130A (i.e., the epitaxial layer) and the second active layer 150 are optimally oriented for the opposite charge carrier devices. That is, the first active area 130A includes a {100} layer for a NMOS device, and the second active layer 150 includes a {110} layer for a PMOS device. In other embodiments, the first active layer 130A is doped for a PMOS device, and the second active layer 150 is doped for an NMOS device. In still other embodiments where maximum carrier mobility is not a primary concern, CMOS structures may comprise other epilayer and SOI silicon orientations. For example, an embodiment may comprise an NFET on a {110} orientation with a <110> channel, or a PFET on a {111} orientation with a <112> channel.

Although the present invention and its advantages have been described in detail, it will be readily understood by those skilled in the art that crystallographic orientations and directions may be varied while remaining within the scope of the present invention. For example, many of the features and functions regarding CMOS fabrication on SOI hybrid substrate orientations discussed above may be combined with other mobility enhancing methods.

One exemplary combination includes the addition of a stress-inducing film to SOI hybrid orientation embodiments. For example, those skilled in the art know that it is desirable to induce a tensile strain in the channel of n-channel transistors in the source to drain region. It is also desirable to induce a compressive strain in the channel of p-channel transistors in the same direction.

When the strain is applied to both PFETs and NFETs with <110> channels, the NFET and PFET channels might be preferably non-parallel to avoid stress induced degradation in either NFET or PFET. It is known that tensile stress is beneficial for NFET, but for PFET, the compressive stress is preferred. Thus, choosing proper crystal orientations in which one is stress-sensitive and the other is stress-insensitive is a way to resolve this dilemma of strain effect on NFET and PFET.

Strain-inducing STI structures may also be optimized to selectively induce stress in n-channel and p-channel transistors separately. For example, a first isolation trench includes a first liner, and a second isolation trench includes a second liner, or none at all. By way of example, a liner may be a nitride layer. The second trench may be lined with a nitride layer that has been modified, e.g., implanted with ions or removed. In another example, the first material can be an oxynitride (a nitrided oxide). In this case, the second trench may be lined with an oxide liner or no liner at all, as examples. A liner can then be modified in some but not all of the plurality of trenches.

Although the present invention and its advantages have been described in detail, it should be understood that various changes, substitutions and alterations may be made herein without departing from the spirit and scope of the invention as defined by the appended claims. For example, many of the features and functions discussed above may be implemented with other semiconductor technology. Examples of other technologies combinable with embodiments include additional devices such as guard rings, scrap lines, seal rings, metal pads, bipolar transistors, or diodes on substrates of single orientation.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a CMOS integrated circuit comprising:
   forming a recess through a first semiconductor layer having a first crystal orientation, through a dielectric layer overlying the first semiconductor layer, and through a second semiconductor layer overlying the dielectric layer and having a second crystal orientation different than the first orientation, the recess defining an active region;
   removing the second semiconductor layer and the dielectric layer in the active region;
   filling the recess with an insulator; and
   epitaxially growing semiconductor material having the first crystal orientation in the active region.

2. The method of claim 1 further comprising removing the insulator from the active region.

3. The method of claim 1 wherein the second semiconductor layer and the dielectric layer are removed from the recess and from the active region simultaneously, followed by removal of the first semiconductor layer in the recess.

4. The method of claim 1 wherein the first semiconductor layer is an N-type semiconductor layer having a {110} surface orientation, and the second semiconductor layer is a P-type semiconductor layer having a {110} surface orientation.

5. The method of claim 4 further comprising forming a PMOS device having a charge carrier channel aligned with a <110> crystallographic direction, and forming an NMOS device having a charge carrier aligned with a <100> crystallographic direction.

6. A method of fabricating a semiconductor structure, the method comprising:
   providing a double SOI substrate, the double SOI substrate having a first region and a second region, the first region having a first crystal orientation, the second region having a second crystal orientation, wherein the second crystal orientation is different than the first crystal orientation;
   forming a first recess adjacent the first region;
   forming a second recess adjacent the second region;
   forming a third recess over the second region;
   forming isolation regions by filling the first and second recesses with an insulator; and
   forming an epitaxial silicon layer in the third recess.

7. The method of claim 6 wherein the semiconductor structure is a hybrid orientation substrate.

8. The method of claim 6 wherein the first region is an N-type semiconductor layer and the second region is a P-type semiconductor layer.

9. The method of claim 8 wherein the N-type semiconductor layer has a {110} surface orientation and the P-type semiconductor layer has a {110} surface orientation.

10. The method of claim 6 wherein the first region is a P-type semiconductor layer and the second region is an N-type semiconductor layer.

11. The method of claim 10 wherein the N-type semiconductor layer has a {110} surface orientation and the P-type semiconductor layer has a {110} surface orientation.

12. The method of claim 6 further comprising planarizing the semiconductor structure so that the isolation regions and the epitaxial silicon layer are coplanar.

13. A method of fabricating a semiconductor device, the method comprising:
   providing a double SOI substrate, the double SOI substrate having a first region and a second region, the first region having a first crystal orientation, the second region have a second crystal orientation, wherein the second crystal orientation is different than the first crystal orientation;
   forming a first recess adjacent the first region;
   forming a second recess adjacent the second region;
   forming a third recess over the second region;
   filling the first, second, and third recesses with an insulator;
   replacing the insulator in the third recess with an epitaxial silicon layer, wherein the epitaxial silicon layer has a crystal orientation the same as the second crystal orientation;
   forming a first MOS device in the first region, wherein the MOS device is one of PMOS and NMOS; and
   forming a second MOS device in the second region, wherein the second MOS device is the other of PMOS and NMOS.

14. The method of claim 13 wherein forming a double SOI substrate comprises forming a first buried oxide (BOX) layer over a support substrate, a first semiconductor layer having a first orientation over the first BOX layer, a second BOX layer over the first semiconductor layer, a second semiconductor layer having a second orientation over the second BOX layer, a pad oxide layer over the second BOX layer, a first hard mask layer over the pad oxide layer, and a second hard mask layer over the first hard mask layer.

15. The method of claim 14 wherein forming the first recess comprises directionally etching through the first and second hard masks, the pad oxide layer, the first and second semiconductor layers, and the second BOX layer.

16. The method of claim 14 wherein forming the second recess comprises directionally etching through the first and second hard masks, the pad oxide layer, the second semiconductor layers, and the second BOX layer.

17. The method of claim 13 wherein first MOS device comprises an NMOS device and the second MOS device comprises a PMOS device.

18. The method of claim 17 the NMOS device comprises a charge carrier channel region aligned with a <100> crystallographic direction.

19. The method of claim 17 the PMOS device comprises a charge carrier channel region aligned with a <110> crystallographic direction.

20. The method of claim 13 wherein first MOS device comprises a PMOS device and the second MOS device comprises a NMOS device.

21. The method of claim 20 the PMOS device comprises a charge carrier channel region aligned with a <110> crystallographic direction.

22. The method of claim 20 the NMOS device comprises a charge carrier channel region aligned with a <100> crystallographic direction.

23. The method of claim 13 wherein the double SOI substrate comprises a material selected from the group consisting essentially of Si, SiC, Ge, GaAs, GaAlAs, InP, GaN, an oxide layer, and combinations thereof.

24. The method of claim 13 wherein the epitaxial silicon layer is formed using rapid thermal chemical vapor deposition (RTCVD).

25. The method of claim 14 wherein forming the first recess and filling the first recess with an insulator comprises forming an isolation region.

26. The method of claim 25 wherein the isolation region comprises a shallow trench isolation region.

* * * * *